United States Patent [19]

Capek et al.

[11] 4,370,630

[45] Jan. 25, 1983

[54] ISOLATING CONNECTOR

[75] Inventors: Raymond G. Capek, Elmhurst; Elgie E. Garrett, Chicago, both of Ill.

[73] Assignee: Zenith Radio Corporation, Glenview, Ill.

[21] Appl. No.: 264,924

[22] Filed: May 18, 1981

[51] Int. Cl.³ .............................................. H03H 7/01
[52] U.S. Cl. .................................. 333/24 C; 333/206; 333/260; 333/185; 339/147 R; 361/43
[58] Field of Search .................. 333/12, 172, 181–184, 333/185, 206, 24 C, 260; 361/43; 339/143 R, 147 R; 343/850, 851, 906; 455/300

[56] References Cited

U.S. PATENT DOCUMENTS

| | | | |
|---|---|---|---|
| 3,913,038 | 10/1975 | Carter et al. | 333/70 R |
| 3,980,976 | 9/1976 | Tadama et al. | 333/260 X |
| 4,122,416 | 10/1978 | Oblak et al. | 333/12 X |
| 4,267,529 | 5/1981 | Brun et al. | 333/185 X |

Primary Examiner—Paul L. Gensler

[57] ABSTRACT

An isolating connector is disclosed for isolating the center conductor of a shielded cable from DC and low frequency AC potentials. The connector includes a generally tubular shell which is connected to the cable's shield and within which a connector pin is located for coupling to a female plug. A capacitance inside the shell is connected in series with the pin and the cable's inner conductor. Also inside the shell are two bleeder resistances, one connected in parallel with the capacitance and another connected in series between the shell and the connector pin. With this arrangement, any DC or low frequency AC potential appearing on the cable's inner conductor is isolated from the connector pin, and a discharge path is provided for the capacitance in the shell and any capacitance serially coupled with the cable's shield.

3 Claims, 3 Drawing Figures

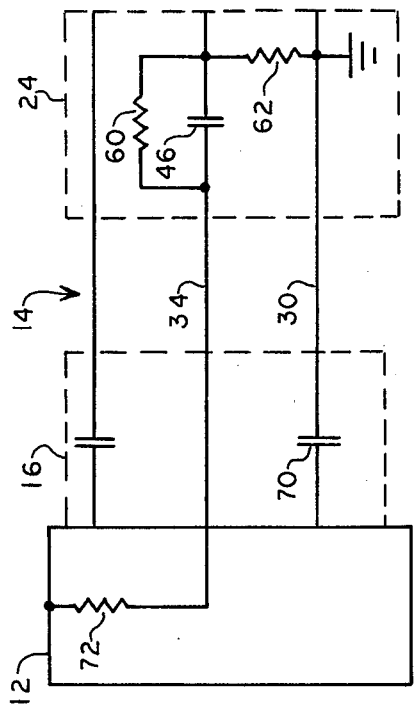
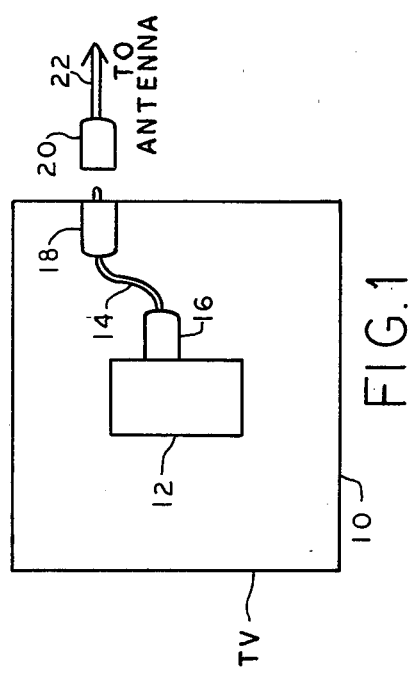
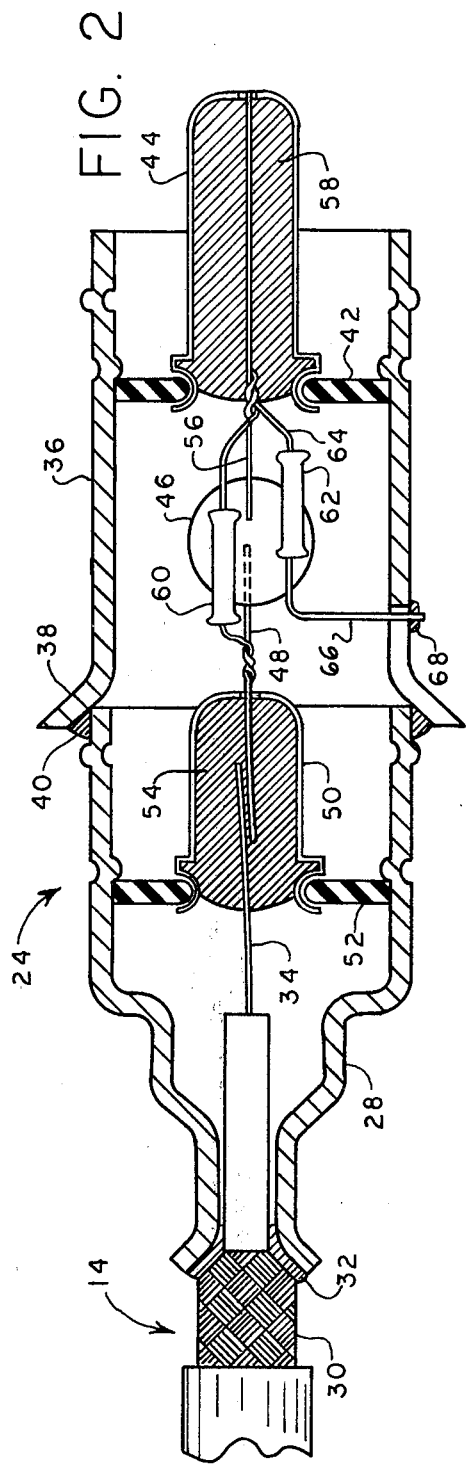

ISOLATING CONNECTOR

BACKGROUND OF THE INVENTION

This invention is generally directed to DC and low frequency AC isolation of shielded conductors. It is particularly directed to AC line isolation of coaxial cables of the type used to couple an antenna to the tuner of a television receiver.

Some television manufacturers currently sell receivers having a so-called "hot chassis", meaning that the receiver's chassis may be at the potential of the AC power line. For consumer protection, various components of the receiver, such as the tuner, are isolated from the hot chassis. However, it is desirable to include an additional level of AC isolation, especially for hot chassis receivers. The function of the extra level of isolation is to further isolate the tuner input from antenna connectors usually located on the rear panel of the receiver. Thus, should the first level of isolation fail, a consumer would still not receive an electrical shock when connecting an antenna or cable lead to the connectors on the receiver's rear panel.

A conventional approach to providing the second level of isolation is to couple the connectors on the receiver's rear panel to the tuner via a shielded cable whose inner and outer conductors are incapable of passing the AC line frequency. Typically, this cable may be in two parts and joined together capacitively so that low frequency AC cannot pass. The point at which the capacitive coupling is effected is typically housed in a metal box to prevent ambient radiation from coupling to the desired television field within the cable. This approach is described more fully in the discussion of prior art found in U.S. application Ser. No. 184,720, filed Sept. 8, 1980.

Another approach to second level isolation is disclosed in U.S. application Ser. No. 282,824 filed July 13, 1981 which is a continuation-in-part of U.S. application Ser. No. 132,020 filed Mar. 20, 1980, abandoned. Briefly, the latter approach AC isolates the shield of a cable between the connectors on the receiver's rear panel and the tuner by including a ceramic capacitor in the cable's shield connection to the tuner. It avoids the need for a metal box around this connection by the inclusion of ferrite material for absorbing ambient radiation. However, this approach does not provide AC isolation for the cable's center conductor.

Accordingly, it is an object of the present invention to provide an improved AC line isolator.

It is a more specific object of the invention to provide a DC and AC line isolator which isolates the center conductor of a coaxial cable but which does not require a metal box to shield the conductor from ambient radiation.

DESCRIPTION OF THE PREFERRED EMBODIMENT

Referring to FIG. 1, the numeral 10 designates a conventional television receiver which may be of the hot chassis or cold chassis type. Inside the receiver, there is a tuner 12 which is generally enclosed in a metal shield. For hot chassis receivers, the tuner is typically insulated from the chassis by a first level of isolation.

Connected to the tuner is a coaxial cable 14 terminating in connectors 16 and 18. The connector 16 couples the cable to the tuner and includes, in its enclosure, means for capacitively coupling the tuner's shield to the outer shield on the coaxial cable 14. Thus, should a DC or low frequency AC potential appear on the tuner, that potential is isolated from the cable's shield. Such capacitive isolation is disclosed, for example, in the previously mentioned U.S. application, Ser. No. 132,020.

The connector 18 typically couples the cable 14 to the rear panel of the television receiver. At that point, another connector 20 and its cable 22 carry a television signal from an antenna or from any other signal source.

The arrangement described above is intended to protect a consumer from receiving an electrical shock when coupling the connector 20 to the connector 18. Thus, any DC or line frequency potential which may appear on the tuner is isolated from the shield of cable 14 and from the outer shell of the connector 18.

To provide further protection for the consumer, it is desirable to also isolate the inner conductor of the cable 14 from any potential it may receive from the tuner 12. This may be accomplished conventionally by including a capacitor inside the tuner 12 and in series with the inner conductor of the cable 14. However, this approach requires modification of the tuner and is not practical in all cases. The present invention eliminates the need for modifying the tuner 12 and provides an improved connector which replaces the conventional connecter 18 for isolating the inner conductor of the cable 14. Hence, a television receiving may be retrofitted with a new cable 14 having the improved connector. This provides a relatively inexpensive solution to the problem of line isolation and requires no modification to the receiver other than replacement of the cable 14.

Referring now to FIG. 2, an isolating connector 24 is shown which replaces the connector 18 of FIG. 1. The illustrated connector has a generally tubular shell 36 which is preferably of two piece construction. One piece 28 of the shell has an end which terminates in a relatively small diameter for mating with the cable 14. The shield 30 of the cable 14 may be soldered to the shell piece 28 as at 32, and the cable's inner conductor 34 is brought inside the shell piece 28.

The opposite end of the piece 28 terminates in a relatively wider diameter for mating with one end of the other shell piece 36. This end of the piece 36 flares outwardly as shown at 38 to receive the shell piece 28. Solder 40 may be used to join the shell pieces 28 and 36 together.

The other end of the piece 36 carries an inner annular insulator 42 which supports a connector pin 44. As shown, the pin extends somewhat beyond the shell for mating with a female connector.

To provide RF coupling between the pin 44 and the inner conductor 34, a capacitor 46 is disposed within the shell 36. One lead 48 of the capacitor is inserted within a hollow, tubular member 50. The member 50 is supported within the shell by an annular insulator 52. Also received within the member 50 is the cable's inner conductor 34. Solder 54 electrically connects the conductor 34 to the lead 48 within the tubular member.

The tubular member 50 serves not only to couple the lead 48 to the conductor 34, but also to act as a physical support for the inner conductor and hold it from contact with the shell.

The other lead 56 from the capacitor is inserted within the pin 44 and held there by solder 58. Thus, DC or low frequency AC potential on the inner conductor 34 is isolated from the pin 44 while RF is allowed to pass. A ceramic disc capacitor of about 700 picofarads is suitable for this purpose.

To bleed charge off the capacitor 46, a resistance 60, typically of about 1.5 million ohms, is coupled in parallel with the capacitor. As shown, the leads from the resistance 60 may be twisted around the capacitor leads 48 and 56 and soldered thereto within the tubular member 50 and the pin 44.

Another bleeder resistance 62, typically about ten thousand ohms, is disposed within the shell 26 to bleed charge off the capacitance which is included in the connector 16 (FIG. 1) and which is in series with the cable's shield. This function is described in more detail below. Suffice it to say at this point that one lead 64 from the resistance 62 may be twisted around the capacitor lead 56 and soldered thereto in the pin 44. The other lead 66 may be soldered to the shell 36 as indicated at 68.

Referring now to FIG. 3, an electrical equivalent circuit is shown which includes the connectors 24 and 16, the tuner 12 and the cable 14. As shown, the connector 16 provides a capacitance 70 in series with the outer conductor 30 of the cable 14. Typically, the center conductor is coupled to a resistance 72 which is disposed within the tuner and connected to the tuner's shield. Other circuitry (not shown) within the tuner receives the RF signal carried by the inner conductor.

To provide a discharge path for the capacitance 70, the resistor 62 is electrically connected between the cable's shield and its inner conductor. Any charge collected on the capacitance 70 thus flows through the shield 30 and resistances 62 and 60, through the center conductor 34 to the resistance 72, and back to the other side of the capacitance 70 via the tuner's shield and the shield 30 on the cable 14.

In construction, the capacitor 46 and the resistors 60 and 62 may be covered and enclosed within an epoxy coating or package. Inside the package, their leads may be soldered together so that only three separate leads (leads 48, 56 and 66 in FIG. 2) need be brought out of the package.

Before soldering the shell pieces 28 and 36 together, the package is inserted in the shell piece 28 and soldered to the tubular member 50. The lead 66 (FIG. 2) may be left long enough to extend outside the shell. Then the shell piece 36 may be slipped over the package and mated with the other shell piece. A slit (not shown) may be included in the flared end of the shell piece 36 to receive the lead 66. Then the lead 66 may be soldered to the piece 36, and the pin 44 may be soldered to the package.

From the foregoing description, it will be appreciated that the isolating connector 24 provides an economical and effective device for isolating the inner conductor of a shielded cable. Preferably, the connector 24 is coupled to a cable which carries a connector on its other end for isolating the cable's shield. Thus, a single cable with its connectors provides complete cable isolation. The resultant cable assembly is easily and quickly installed in a television receiver to provide a second level of isolation.

Although the invention has been described in terms of an illustrative embodiment, it will be obvious to those skilled in the art that various alterations and modifications may be made without departing from the invention. By way of example only, the capacitor 46 and resistances 60 and 62 may be constructed on a single thick film substrate and disposed within the connector shell rather than using discrete components. Other changes may be made to suit the connector to a particular applications. Accordingly, all such alterations and modifications are intended to be considered as within the spirit and scope of the invention as defined by the appended claims.

What is claimed is:

1. In a cable having an outer shield surrounding an inner conductor, and having a connector on one end of the shield which capacitively isolates the shield to prevent conduction of DC and low frequency AC currents in the shield, an isolator for the cable's center conductor, comprising:
    a connector plug having a generally tubular shell, one end of which is adapted to connect electrically to the cable's shield and to receive the shield's inner conductor inside the shell, and an opposite end which is adapted to mate with a female plug;
    a connector pin;
    means for supporting the connector pin within the shell while electrically isolating the pin from the shell so that the pin extends from said opposite end of the shell;
    a capacitance disposed within the shell and electrically connected in series with the connector pin and the cable's inner conductor;
    a first bleeder resistance disposed within the shell and electrically connected in parallel with said capacitance; and
    a second bleeder resistance disposed within the shell and electrically connected in series with the shell and the connector pin,
    whereby the cable's inner conductor and the connector pin are isolated from each other for DC and low frequency AC currents while higher frequency AC currents are coupled from the pin to the inner conductor, and the capacitance coupled to the inner conductor and the cable's shield is provided with bleeder resistance.

2. An isolator as set forth in claim 1 wherein said shell is a two piece shell, the first piece of which terminates at one end in a relatively small diameter for mating with the cable, and which terminates at its other end in a relatively larger diameter, the second piece of the shell having one end opposite the pin which flares outwardly for receiving the larger diameter end of the first piece.

3. An isolator as set forth in claim 2 further including a hollow, tubular member disposed within said first piece of the shell and insulated therefrom to receive the cable's center conductor and a lead from said capacitance so that the center conductor and the lead may be soldered to the tubular member, and the cable's center conductor is supported by the tubular member to hold it from contact with the shell.

* * * * *